US012763269B2

(12) United States Patent
McKee et al.

(10) Patent No.: US 12,763,269 B2
(45) Date of Patent: Oct. 13, 2026

(54) REMOTE CONTROL

(71) Applicant: Hunter Fan Company, Memphis, TN (US)

(72) Inventors: Charles David McKee, Memphis, TN (US); Matthew McPherson, Lakeland, TN (US); Douglas Troy Mason, Horn Lake, MS (US)

(73) Assignee: Hunter Fan Company, Memphis, TN (US)

( * ) Notice: Subject to any disclaimer, the term of this patent is extended or adjusted under 35 U.S.C. 154(b) by 67 days.

(21) Appl. No.: 19/039,238

(22) Filed: Jan. 28, 2025

(65) Prior Publication Data

US 2026/0221354 A1 Jul. 30, 2026

(51) Int. Cl.
*H05K 5/02* (2006.01)
*H01H 9/02* (2006.01)

(52) U.S. Cl.
CPC ......... *H01H 9/0235* (2013.01); *H05K 5/0217* (2013.01)

(58) Field of Classification Search
CPC .. H05K 5/0217; H05K 5/0017; H05K 5/0204; H05K 5/0086; H05K 5/023; H05K 5/03; H05K 5/10; H01H 9/0235; H01H 9/0207; H01H 9/0242; H01H 9/08; H01H 9/16; H01H 9/168; H01H 9/18
See application file for complete search history.

(56) References Cited

U.S. PATENT DOCUMENTS 7,463,134 B1 * 12/2008 Stilley .................... A45C 11/18 340/5.61
7,499,283 B2 * 3/2009 De Los Santos ....... B60R 25/24 361/752
7,592,925 B2 * 9/2009 Nearhoof ............. H05B 39/086 340/815.4
8,072,766 B2 * 12/2011 Shimura ................ H01H 13/86 361/752
8,836,486 B2 * 9/2014 Saito .................. G07C 9/00944 455/90.3

(Continued)

FOREIGN PATENT DOCUMENTS

CN 209234123 U 8/2019
CN 209374293 U 9/2019

(Continued)

OTHER PUBLICATIONS

PZL. "PZL Replacement for MERACH Vibration Plate Exercise Machine MR-2398 MR-2398P Remote Control, for Yesoul YS-VM60, for ZENACTIVE Vibration Plate." Amazon.com, Dec. 31, 2024, www.amazon.com/PZL-Replacement-Vibration-Exercise-ZENACTIVE/dp/BODQPGYP4S/ref=ast_sto_dp_puis. Accessed Jun. 8, 2026. (Year: 2024).*

*Primary Examiner* — Abhishek M Rathod

(74) *Attorney, Agent, or Firm* — McGarry Bair PC; Mark A. Davis

(57) ABSTRACT

A remote control comprising an inner structural housing having a printed circuit board (PCB) mount and a battery recess, a PCB mounted to the PCB mount and having multiple switches, an outer housing having an open-face body partially defining an interior, and a facia closing the open-face body and having multiple actuators, wherein the inner structural housing is received within the interior such that the PCB faces the facia and the actuators are in correspondence to the switches.

10 Claims, 7 Drawing Sheets

(56) References Cited

U.S. PATENT DOCUMENTS

| | | | | |
|---|---|---|---|---|
| 9,384,657 | B2 * | 7/2016 | Mullet | E05F 15/77 |
| 9,589,457 | B1 * | 3/2017 | Wengreen | G08C 17/02 |
| D818,444 | S * | 5/2018 | Clymer | D13/168 |
| 10,782,188 | B2 * | 9/2020 | Shivell | F21V 23/005 |
| 11,236,857 | B2 | 2/2022 | Willis et al. | |
| 2007/0241929 | A1 * | 10/2007 | Marchetto | H01H 9/0235 D14/218 |
| 2009/0247242 | A1 * | 10/2009 | Wojack | H04M 1/23 29/827 |
| 2012/0104197 | A1 * | 5/2012 | Jensen | F16M 13/02 248/309.4 |
| 2016/0307714 | A1 * | 10/2016 | Bhate | H01H 13/70 |
| 2019/0287743 | A1 * | 9/2019 | Wisniewski | H01H 13/7057 |
| 2021/0365170 | A1 | 11/2021 | Willis et al. | |

FOREIGN PATENT DOCUMENTS

| | | | |
|---|---|---|---|
| CN | 209561225 | U | 10/2019 |
| CN | 217985681 | U | 12/2022 |
| EM | 0023502150001 | S | 11/2013 |
| EP | 3591680 | A1 | 1/2020 |
| GB | 90023502150001 | S | 11/2013 |

* cited by examiner

REMOTE CONTROL

TECHNICAL FIELD

The invention generally relates to a remote control, and more specifically for a wall-mounted remote control.

BACKGROUND

Remote controls are useful for controlling the operation of a device without the need for the user to physically interact with the device. For most devices, it is acceptable for the remote control to be placed on a tabletop or other horizontal surface.

A small subset of remote controls, such as those used with ceiling fans, are wall-mounted, for convenience near a light switch for the room or as one enters the room. The wall mounted remote controls, unlike the tabletop remote controls, typically include a bracket for holding the remote control to the wall.

DETAILED DESCRIPTION

Figure 1:
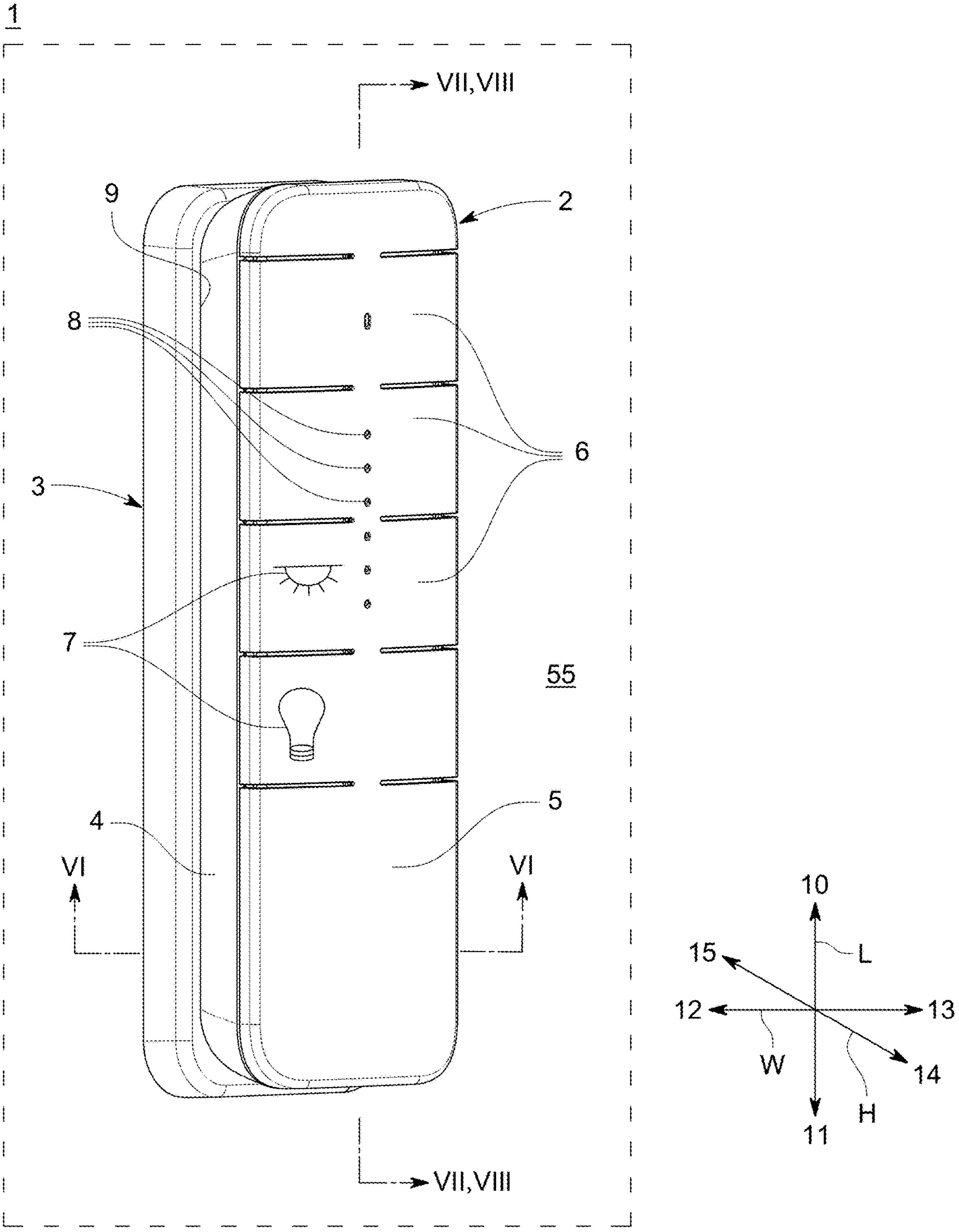
FIG. 1 is a perspective view of a remote control assembly including a remote control and a complementary cradle, with the remote control seated in the cradle, and the cradle mounted to a wall.

Remote controls are used to control the operation of a device without having to physically contact the device. In most cases, it is acceptable for the remote control to be laid on a surface, like a table or desk, where the surface will support the remote control from falling and the remote control is easily accessible by a user. In some instances, it is desirable to mount the remote control to a wall. Such a mounting must hold the remote control from falling. A past common solution is to provide a wall-mounted cup or some similar structure that receives an end of the remote control in a vertical arrangement. A difficulty with the cup is that the remote control must be lifted up to clear the top edge of the cup. Some users, in haste or lack of attention, will tend to pull the remote control from the cup without sufficient lifting to clear the cup, which leads to scraping the remote control across the edge of the cup or the remote control binds in the cup and resists, both of which can lead to damage of the remote control.

Some wall-mounted remote controls use a magnetic connection to magnetically secure the remote control to the wall. Some magnetic mounts have a partial housing with a magnet or magnetic plate, with the housing shaped to receive an upper end of the remote control. The partial housing can lead to misalignment of the magnetic connection, especially if the user is not paying full attention. This misalignment can lead to insufficient magnetic connection or no connection at all and the remote control falls to the ground when the user lets go thinking the remote control is secure.

This disclosure relates to a wall-mounted remote control that uses a wall-mounted cradle having a full-length seat to completely receive the remote control. A magnetic connection is provided between the remote control and the cradle such that when the remote control is seated within the full-length seat, a magnetic connection is made and secures the remote control to the cradle. The full-length seat provides tactile feedback to the user when the remote control has been properly seated. The full-length seat additionally has a lower end wall against which the lower end of the remote control will bear, which retards the remote from falling when the user has not quite yet completely seated the remote control and may be starting to loosen their grip.

Additionally, alternatively, or optionally, the height of the remote control is sufficiently greater than the height of the seat, such that a sufficient portion of the remote control extends above the cradle so that the cradle does not interfere with the seating or removal of the remote control. The magnetic connection between the remote control and the cradle helps make possible that the remote control can extend such a height above the cradle because without the magnetic connection, the seat is not deep enough or configured to hold the remote control in the seat based on physical interference alone.

The magnetic connection is advantageously located at a lower end of the remote control and the seat. This location encourages the user to seat the lower end of the remote control in the seat. If the upper end is not seated at the same time as the lower end, the user can easily settle the upper end of the remote control into the seat. Seating and magnetically securing the lower end first also reduces the likelihood of the remote control sliding out of the cradle from partial or misalignment as it encourages proper and complete alignment.

FIG. 1 illustrates an example of such a remote control assembly 1 including a remote control 2 and a cradle 3 mounted to a wall 55. As illustrated, the cradle 3 is mounted to the wall 55 in a vertical orientation and the remote control is seated in the cradle. The remote control has an outer housing 4 closed by a facia 5 having a plurality of actuators 6, with indicia 7, and indicator lights 8. The indicia 7 relate to settings or other features of a device being controlled by the remote control 2. The cradle has a seat 9. The outer housing 4 is shaped to be received within the seat 9 when the remote control 2 is seated in the cradle 3. The seat 9 is illustrated as a full-length seat that completely receives the outer housing 4. The outer housing 4 and the facia 5, while having structural and operational features, can also be designed to provide an aesthetic appearance for the remote control.

The remote control assembly extends in three dimensions shown by axes. A length dimension L extends longitudinally from an upper end 10 to a lower end 11 of the remote control assembly 1. A width dimension W extends laterally from a first side 12 to a second side 13 of the remote control assembly 1. A height dimension H extends from a front end 14 to a rear end 15 of the remote control assembly 1.

Figure 2:
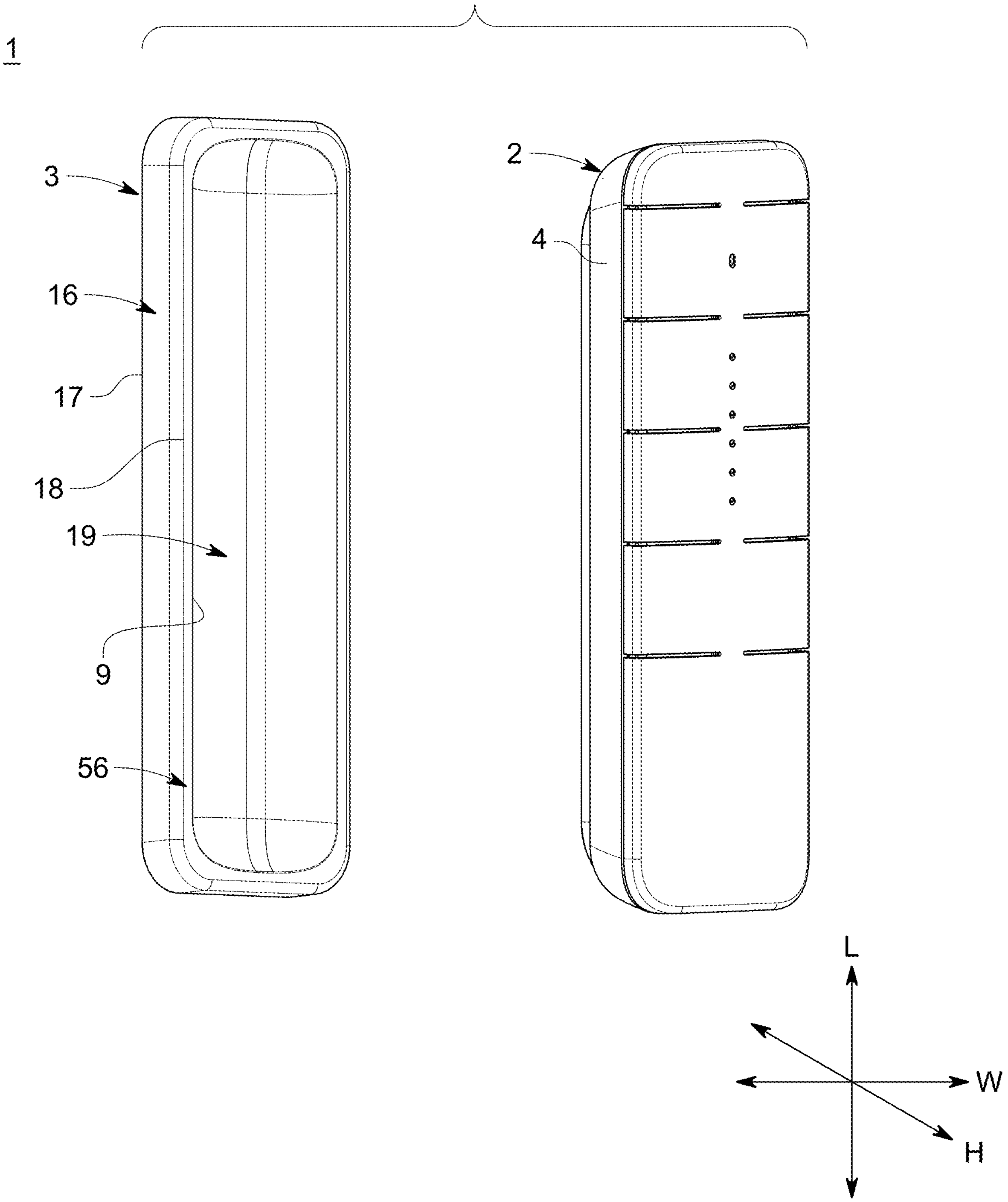
FIG. 2 is a perspective view of the remote control and cradle, with the remote control removed from the cradle.

FIG. 2 illustrates the remote control assembly 1 while the remote control 2 is unseated and the cradle 3 is not mounted to a wall. The cradle 3 is illustrated with a peripheral wall 16 extending from a peripheral rear edge 17, configured to abut the peripheral wall 16, to a peripheral front edge 18 forming a peripheral edge that defines a front face 56 and which bounds a recess 19 forming the seat 9. The front face 56 is illustrated as flat, but other shapes are possible. The front face 56 has a width that forms a functional and visual border around the seat 9. The peripheral wall 16, the peripheral rear edge 17, and the peripheral front edge 18 are illustrated as peripheral and continuous but need not be. Any one or all of them could be discontinuous and need not form the outermost periphery.

The outer housing 4 and the recess 19 defining the seat 9 are illustrated as having complementary profiles. The complementary profiles are in all three dimensions, the length L, the width W, and the height H as shown by the axes). It is believed that the complementary dimensions along all three axes will provide the best results for secure seating of the remote control 2 in the cradle 3, it is contemplated that the complementary profiles along two dimensions, the length L and the width W, will provide satisfactory results as well.

The profiles being complementary is useful in that it provides the user with tactile feedback when the outer housing 4 is properly seated in the recess 19. The complementary profiles also help guide the outer housing 4 into a properly seated position within the recess 19 as the user tries to place the outer housing 4 into the recess 19.

Figure 3:
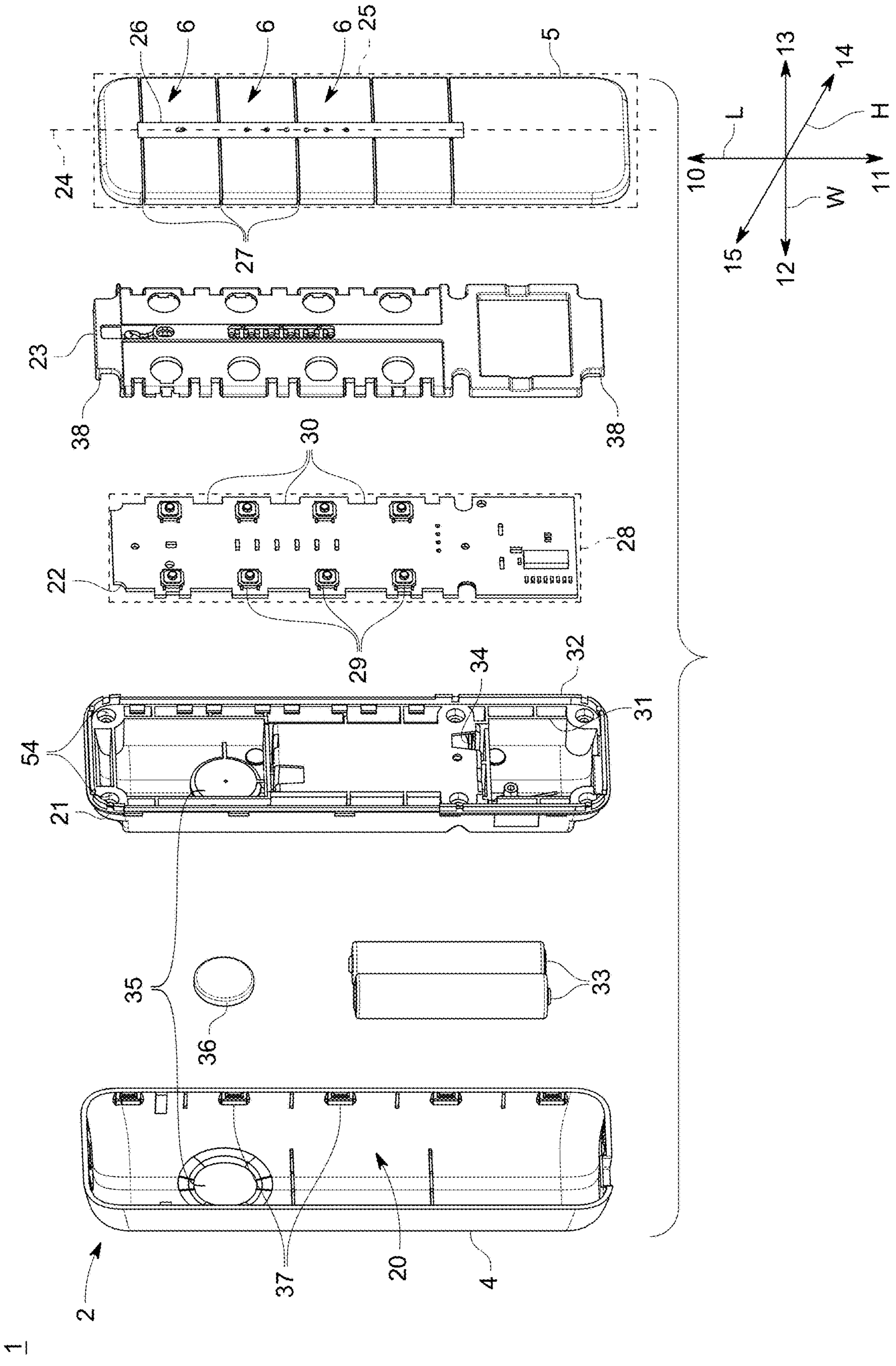
FIG. 3 is an exploded perspective view of the remote control illustrating the major elements of the remote control including an outer aesthetic housing, an inner structural housing, a printed circuit board ("PCB"), a skeletal frame, and a facia closing the outer aesthetic housing.

FIG. 3 illustrates an exploded perspective view of the remote control 2 alone. The outer housing 4 is an open-faced body partially defining an interior cavity 20. The interior cavity 20 contains the major elements of the remote control 2 including an inner housing 21, a PCB 22, and a skeletal frame 23. The interior cavity 20 is closed by and partially defined by the facia 5.

The facia 5 can be a monolithic body defining a longitudinal body axis 24 illustrated by a dashed line extending along the length dimension L from the upper end 10 to the lower end 11 of the remote control assembly 1. The facia 5 also defines a facia outer periphery 25 illustrated by a dotted line. The facia 5 includes multiple actuators 6. In some examples, the actuators 6 are integrally formed in the monolithic body. The actuators can comprise, for example, deflectable tabs. The deflectable tabs each extend outward in the width dimension W from a rib 26 extending along the longitudinal body axis 24. The deflectable tabs are spaced from each other in the lengthwise dimension L by facia slots 27. The facia slots 27 are indentations extending through the facia outer periphery 25. The facia slots 27 can extend generally perpendicularly to the longitudinal body axis 24. Generally perpendicular refers to the facia slots 27 each being an elongated indentation that forms an angle in a range from greater than or equal to 80° and less than or equal to 110° with the longitudinal body axis 24. In the illustrated non-limiting example, a total of eight actuators 6 are arranged in two columns, with four actuators in each column. Additionally or alternatively, the actuators 6 can include buttons or keys that are separately formed from the monolithic body of the facia 5 and subsequently non-integrally coupled with the facia 5.

The PCB 22 comprises a substrate defining a PCB periphery 28 illustrated by a dotted line. The PCB 22 includes multiple switches 29. The actuators 6 are arranged in correspondence to the switches 29. In the illustrated non-limiting example, the switches 29 are arranged in two columns, with four switches in each column corresponding with the similarly arranged actuators 6. The PCB 22 includes catch slots 30 that are indentations along the PCB periphery 28. The catch slots 30 are spaced corresponding to the switches 29 and the facia slots 27. That is, a switch 29 is located at a lengthwise position, a catch slot 30 is formed along the PCB periphery 28 at a higher lengthwise position than the lengthwise position of the switch 29 and a catch slot 30 is formed along the PCB periphery 28 at a lower lengthwise position than the lengthwise position of the switch 29. The catch slots 30 are aligned with the facia slots 27. That is, the catch slots 30 are located at the same lengthwise positions as the facia slots 27.

The inner housing 21 serves as a structural housing supporting the PCB 22. The inner housing 21 includes a PCB mount 31 defining a front face of the inner housing 21. A lip 32 extends forward around a periphery of the inner housing 21 and the PCB mount 31. The PCB mount includes holes 54, which can be tapped, that are sized to accommodate fasteners such as screws or snap-fit pegs. Each of the holes 54 can be threaded to accommodate a screw or can have an inner ledge to accommodate a snap-fit peg. The holes 54 can be located, for example, at outer corners of the inner housing 21, or at other points along a periphery of the outer housing 4.

In addition to supporting the PCB 22, the inner housing also supports at least one battery 33. The inner housing 21 includes a battery recess 34. The battery recess 34 is shaped to accommodate the at least one battery 33. The battery recess 34 is open towards the rear end 15 of the remote control assembly 1 such that the at least one battery 33 is inserted into the battery recess 34. The battery recess 34 is closed by outer housing 4. The at least one battery 33 can be held in place within the battery recess 34 by any suitable means, such as by a spring between the at least one battery 33 and a surface of the battery recess 34. In the illustrated non-limiting example, two batteries 33 are securely held in the battery recess 34. However, it should be appreciated that the number of batteries 33 required to electrically power the remote control 2 is not limited to two, and the battery recess 34 can be sized to accommodate a single battery 33 or more than two batteries 33.

The remote control 2 includes a remote control magnet 36. The remote control magnet 36 is received in a magnet recess 35. The magnet recess 35 can be provided entirely within the inner housing 21 or, as illustrated, can be partially provided within the inner housing 21 and partially provided within the outer housing 4. That is, a portion of a height of the remote control magnet 36 can be accommodated within the inner housing and another portion of the height of the remote control magnet 36 can be accommodated within the outer housing 4. The magnet recess 35 and, accordingly, the remote control magnet 36 are located in an upperend of the remote control 2. Although the magnet recess 35 and accordingly, the remote control magnet 36 are shown at a lateral center (e.g. equidistant from the first side 12 and the second side 13 in the width dimension W), it is contemplated that the magnet recess 36 and the remote control magnet 36 can be located off center in the width dimension W if required by the design of the remote control 2.

The inner housing 21 is secured in the outer housing 4 by a snap-fit connection. The outer housing 4 includes a plurality of hooks 37 extending into the interior cavity 20 from the first side 12 and the second side 13 of the remote control assembly 1. The hooks 37 engage with the lip 32 by at least partially wrapping around the lip 32 forming the snap-fit connection between the inner housing 21 and the outer housing 4.

The skeletal frame 23 secures in place and partially covers the PCB 22. The skeletal frame 23 includes cut-outs shaped to accommodate portions of the PCB 22 such as the switches 29. The skeletal frame includes tabs 38 which extend towards the rear end 15 of the remote control assembly 1.

The remote control 2 is assembled by inserting the at least one battery 33 in the battery recess 34, inserting the remote control magnet 36 in the magnet recess 35, then inserting the inner housing 21 in the outer housing 4. Next, the PCB 22 is placed on the PCB mount 31 within the lip 32 and secured in place with screws or other fasteners. The skeletal frame 23 is then attached to the inner housing 21 by aligning the PCB 22 between the hooks 37. The facia 5 is finally fitted to the outer housing 4, sandwiching the skeletal frame 23 such that it is located between the inner housing 21 and the facia 5, and the remote control 2 is ready for use either seated or unseated on the cradle 3.

In operation, a user can press an actuator 6 to control a device. When pressed, the actuators 6 actuate the switches 29 on the PCB 22. Additionally, indicator lights 8 can provide feedback to the user about the controls being actuated by the remote control 2.

Figure 4:
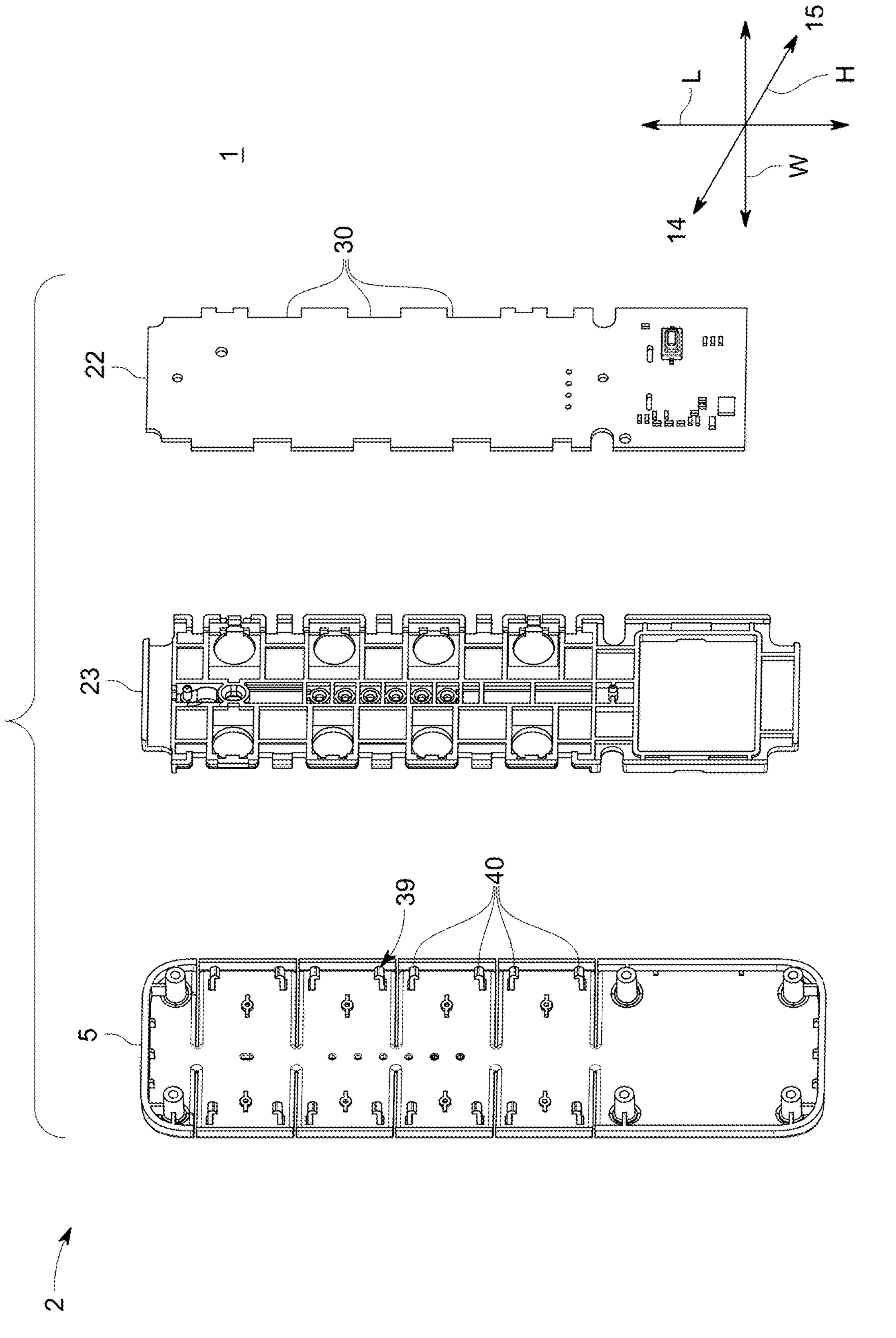
FIG. 4 is an exploded perspective view of the parts of the remote control, namely the PCB, the skeletal frame, and the facia, viewed from the rear end of the remote control.

FIG. 4 illustrates an exploded perspective view of parts of the remote control 2 looking forward towards the front end 14 from the rear end 15 of the remote control assembly 1. The remote control 2 includes a latch 39 securing the facia 5 to the PCB 22. The latch 39 includes the catch slots 30 formed in the PCB 22 and a corresponding plurality of resilient hooks 40. The plurality of resilient hooks 40 each depend from the actuators 6 and extend towards the rear end 15 of the remote control assembly 1. When the remote control 2 is assembled, the plurality of resilient hooks 40 each extend through corresponding cut-outs in the skeletal frame 23 and extend through the catch slots 30 where they then clamp around a surface of the PCB 22 facing the rear end 15.

Figure 5:
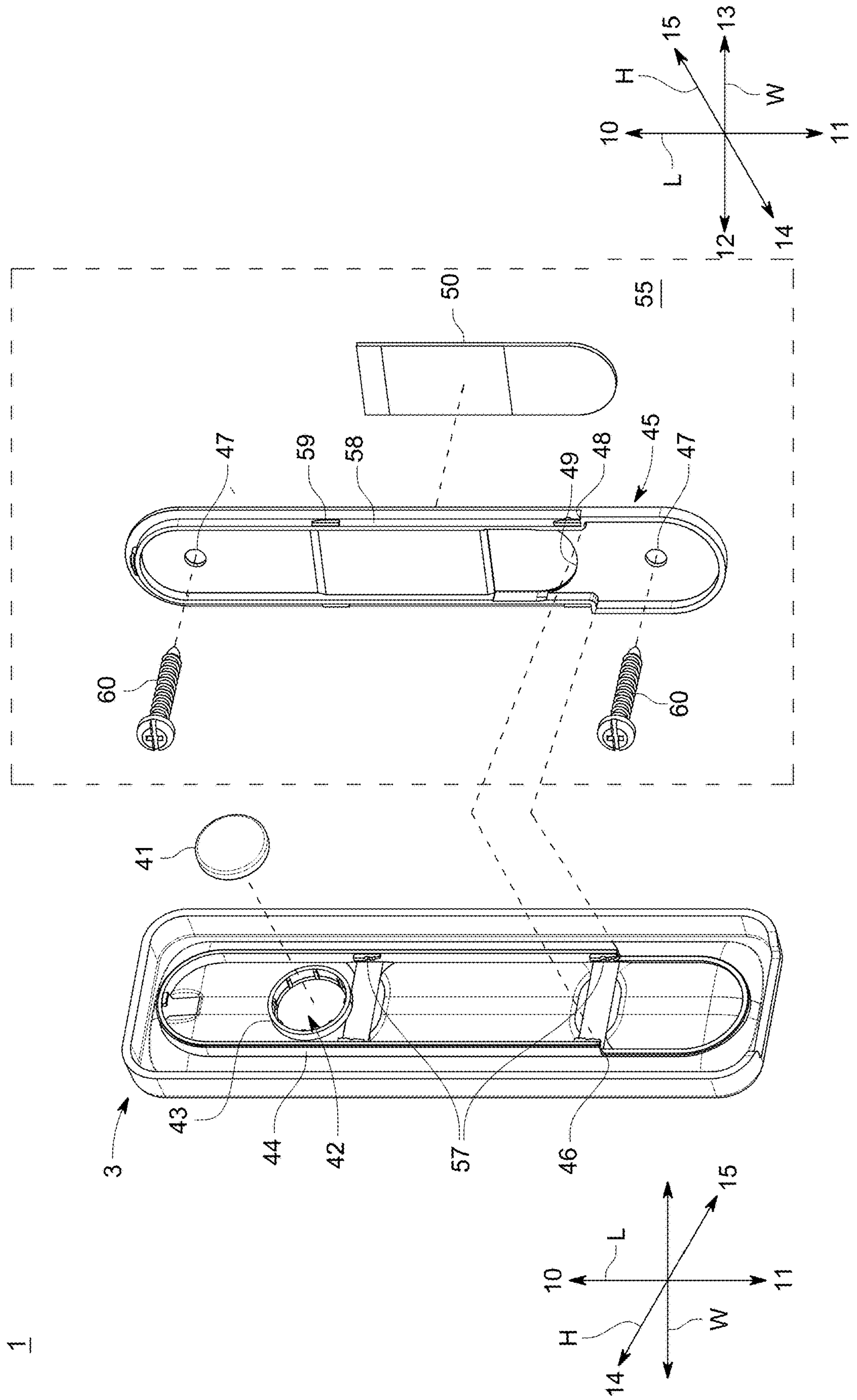
FIG. 5 is an exploded view of the cradle with a wall mount viewed from the rear end of the remote control assembly.

FIG. 5 is an exploded view illustrating the cradle 3 from the rear end 15 of the remote control assembly 1 and a wall mount 45 from the front end 14 of the remote control assembly 1. The cradle 3 is slidingly attached to a wall mount 45, and the wall mount 45 is fixedly attached to the wall 55.

The cradle 3 includes a cradle magnet 41. The cradle magnet 41 is accommodated in a magnet recess 42 defined by a wall 43 extending from a surface of the cradle 2 facing the rear end 15 of the remote control assembly 1. The wall 43 can closely surround a periphery of the cradle magnet 41 such that the cradle magnet 41 can be press-fitted into the magnet recess 42. A position of the cradle magnet 41 is aligned with a position of the remote control magnet 36 such that when the remote control 2 is seated in the cradle 3, a magnetic retention force is applied between the remote control magnet 36 and the cradle magnet 41 to retain the remote control 2 in the recessed front surface of the cradle 3 defining the recess 19 defining the seat 9. The magnet recess 42 and the cradle magnet 41 can be located at a lateral center (e.g. equidistant from the first side 12 and the second side 13 in the width dimension W), or can be located off center in the width dimension W corresponding with the widthwise position of the remote control magnet 36.

To retain the remote control 2 in the recess 19 forming the seat 9, the remote control magnet 36 and the cradle magnet 41 can be located in the upper half of the recess 19 in the length dimension L (e.g. closer to the upper end 10 of the remote control 2 than the lower end 11 of the remote control 2). Therefore, the magnetic retention force applied between the remote control magnet 36 and the cradle magnet 41 can be centered in an upper half of the recess 19 forming the seat 9. For example, the magnetic retention force can be centered between 70% and 80% of the length of the recess, with 0% being located at the lower end 11 of the recess 19 and 100% being located at the upper end 10 of the recess 19.

The cradle 3 includes another wall 44 extending rearward from a surface of the cradle 2 facing the rear end 15 of the remote control assembly 1. A cradle latch 57 extends from the wall 44 towards a center of the cradle 3 perpendicular to the wall 44. The cradle latch 57 can be multiple spaced protrusions along the wall 44 as illustrated or the cradle latch 57 can be a single continuous protrusion about an entire length of the wall 44. The wall 44 and the cradle latch 57 include a cradle alignment ledge 46, which is a reduced height portion compared to a height of the remainder of the wall 44.

The wall mount 45 has a shape corresponding to the wall 44. The wall mount 45 includes a wall 58 extending forward from a surface of the wall mount 45 facing the front end 14 of the remote control assembly 1. The wall 58 is shaped to be closely surrounded by the wall 44 of the cradle 3. A wall mount latch 59 extends from the wall 58 outwards away from a center of the wall mount 45 perpendicular to the wall 58. The wall mount 45 includes a wall mount alignment ledge 48 corresponding in the length dimension L with the alignment ledge 46 of the wall 44. The wall mount alignment ledge 48 extends forward from the wall mount 45 at the same height distance as the full height of the wall 44.

To join the cradle 3 with the wall mount 45, the portion of the cradle 3 facing the lower end 11 of the remote control assembly 1 is slid vertically downwards along the length dimension L onto the wall mount 45 starting from the portion of the wall mount 45 facing the upper end 10 of the remote control assembly 1. Particularly, the wall 44 of the cradle 3 surrounds the wall 58 of the wall mount 45 such that the cradle latch 57 wraps around and engages with the wall mount latch 59. A user can confirm that the cradle 3 is properly in place on the wall mount 45 when the cradle 3 cannot slide any further along the wall mount 45 owing to the cradle alignment ledge 46 contacting the wall mount alignment ledge 48.

The wall mount 45 can be attached to the wall 55 by at least one fastener 60 extending through the wall mount 45 and into the wall 55. Although threaded screws are illustrated as the at least one fastener 60, other fasteners are contemplated including, for example, nails or tacks. The wall mount 45 includes at least one through hole 47 shaped to accommodate the at least one fastener 60.

Additionally or alternatively, the wall mount 45 can be attached to the wall 55 by an adhesive strip 50. The adhesive strip 50 can be, for example, a double-sided adhesive strip such that one surface of the adhesive strip 50 is adhered to a surface of the wall mount 45 facing the rear end 15 of the remote control assembly 1, and another surface of the adhesive strip 50 is adhered to the wall 55. The wall mount 45 includes a cut-out 49. The shape of the cut-out 49 is not particularly limited but can advantageously be a D-shape such that the adhesive strip 50 can be easily removed and therefore the wall mount 45 removed from the wall 55 by a user pulling an end of the adhesive strip 50 towards the front end 14 of the remote control assembly 1 through the cut-out 49.

Figure 6:
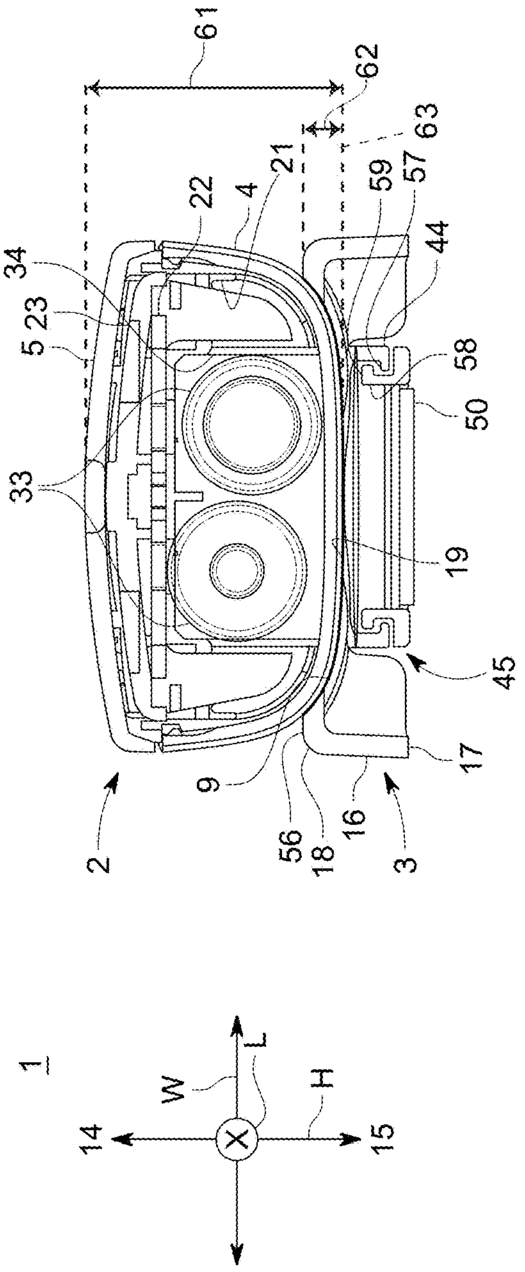
FIG. 6 is a transverse sectional view taken along line VI-VI in FIG. 1 of the remote control seated within the cradle.

FIG. 6 illustrates a sectional view perpendicular to the length dimension L of the remote control 2 seated within the cradle 3. For purposes of illustration, a surface of the cradle 3 facing the front end 14 of the remote control assembly 1 corresponding with the recess 19 defining the seat 9 and a surface of the outer housing 4 facing the rear end 15 of the remote control assembly 1 are illustrated by a thickened line. The outer housing 4 forming the rear surface of the remote control 2 has a transverse curvilinear profile when viewed along a plane perpendicular to the length L as in the perspective of FIG. 6. A curvilinear profile as used herein refers to a shape having only curved portions or a combination of curved and linear portions. In the illustrated non-limiting example, the transverse curvilinear profile of the outer housing 4 forming the rear surface of the remote control 2 is non-linear, meaning that it consists of only curved portions and is free of linear or straight portions.

The outer housing 4 of the remote control 2 is fully received in the width dimension W by the cradle 3. That is, at a height of the remote control 2 where the outer housing 4 intersects the front face 56 of the cradle 3, a total width of the remote control 2 is less than or equal to a total width of the recess 19 forming the seat 9.

The remote control 2 is partially received in the height dimension H by the recess 19 forming the seat 9. That is, the outer housing 4 extends above the front face 56 corresponding with a front most end of the recess 19 forming the seat 9. In a non-limiting example, at least one quarter of a height 61 of the remote control 2 extends beyond the front face 56 when the remote control 2 is seated in the cradle 3. In another non-limiting example, at least ⅔ of the height 61 of the remote control 2 extends beyond the front face 56 when the remote control 2 is seated in the cradle 3. Additionally or alternatively, a recess height 62 extends from a minimum height 63 of the recess 19 forming the seat 9 to the front face 56, the front face 56 corresponding with a maximum height of the recess 19 forming the seat 9. The recess height 62 can be in a range from greater than or equal to 3% and less than or equal to 15% of the height 61 of the remote control 2. For example, the recess height 62 can be in a range from greater than or equal to 9% and less than or equal to 12%.

To retain the remote control 2 in the cradle 3, in addition to the magnetic retention force, a reactive force is applied by the recess 19 forming the seat 9. Particularly, the reactive force is applied from the recess 19 forming the seat 9 to a rear portion of the remote control 2 contained within the recess height 62. In a non-limiting example, the reactive force is applied continuously about the entire extent of the recess 19 forming the seat 9. By setting the recess height 62 and the height 61 of the remote control 2 as described above, accidental removal of the remote control 2 from the cradle 3 by a user is prevented.

The facia 5 forms a front surface of the remote control 2. The facia 5 forming the front surface of the remote control 2 has a transverse curvilinear profile when viewed along a plane perpendicular to the length L as in the perspective of FIG. 6. In a non-limiting example, the facia 5 forming the front surface of the remote control 2 is non-linear, consisting only of curved portions.

Figure 7:
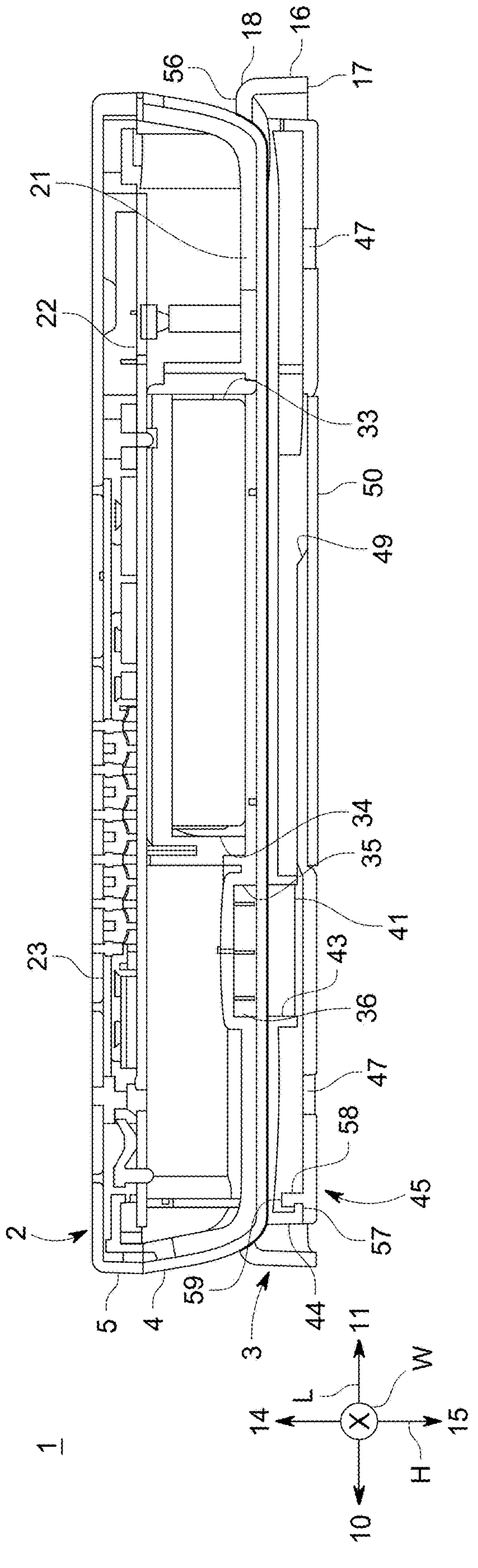
FIG. 7 is a longitudinal sectional view taken along VII, VIII-VII, VIII in FIG. 1 of the remote control seated within the cradle and mounted on the wall mount.

FIG. 7 illustrates a sectional view perpendicular to the width W of the remote control 2 seated within the cradle 3. For purposes of illustration, a surface of the cradle 3 facing the front end 14 of the remote control assembly 1 corresponding with recess 19 defining the seat 9 and a surface of the outer housing 4 facing the rear end 15 of the remote control assembly 1 are illustrated by a thickened line. The outer housing 4 forming the rear surface of the remote control 2 has a longitudinal curvilinear profile when viewed along a plane perpendicular to the width W as in the perspective of FIG. 7. In a non-limiting example, the longitudinal curvilinear profile forming the rear surface of the remote control 2 includes an upper curved portion 51, a lower curved portion 52 opposed to the upper curved portion 51, and a middle linear portion 53 between the upper curved portion 51 and the lower curved portion 52. That is, the middle linear portion 53 of the longitudinal curvilinear profile is located between the upper end 10 and the opposed lower end 11 of the remote control assembly 1.

The outer housing 4 of the remote control 2 is fully received in the length dimension L by the cradle 3. That is, at a height of the remote control 2 where the outer housing 4 intersects the front face 56 of the cradle 3, a total length of the remote control 2 is less than or equal to a total width of the recess 19 forming the seat 9.

Figure 8:
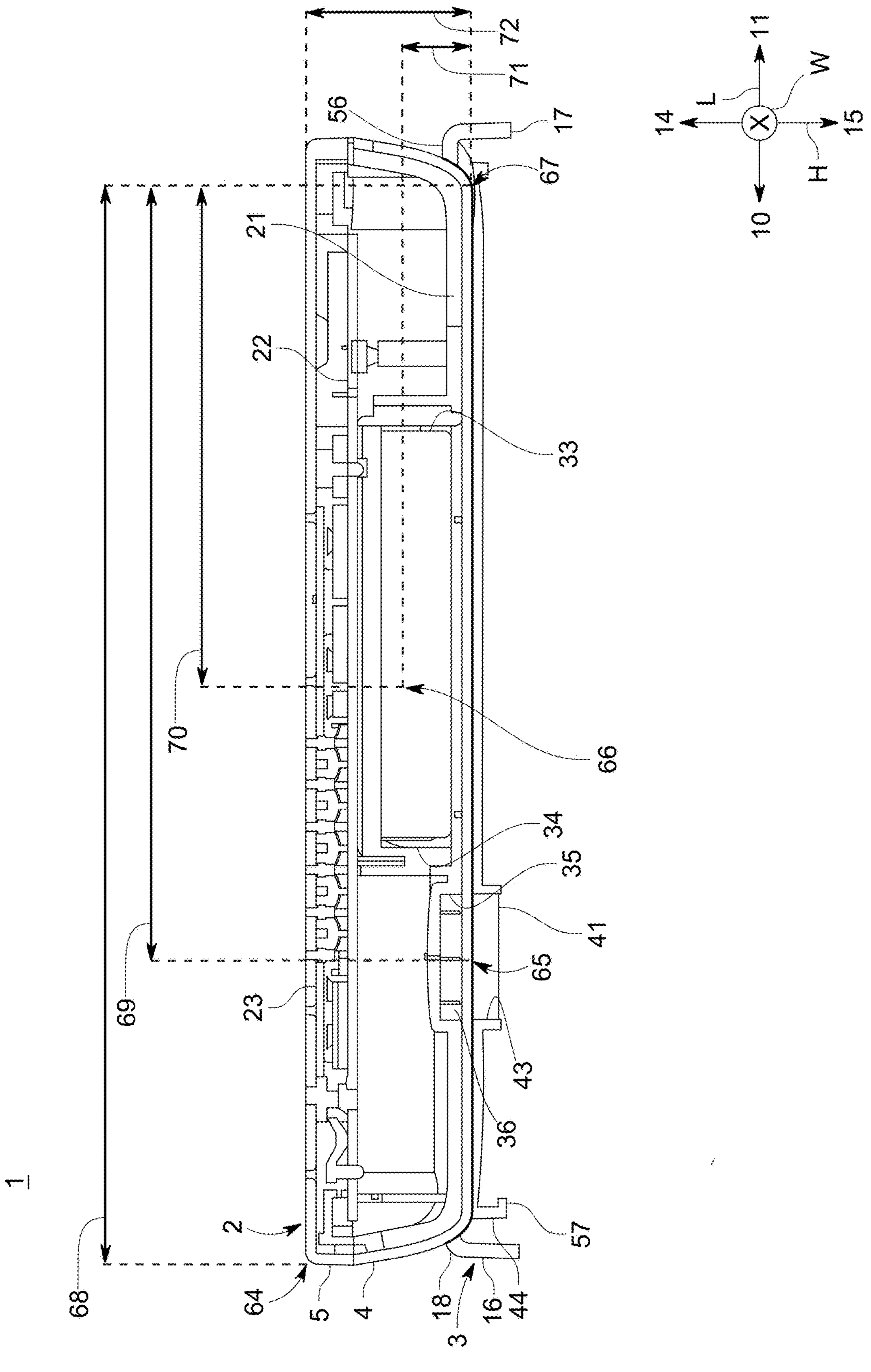
FIG. 8 is an additional longitudinal sectional view taken along line VII, VIII-VII, VIII in FIG. 1 of the remote control seated within the cradle.

FIG. 8 illustrates an additional section view perpendicular to the width W of the remote control 2 seated within the cradle 3. A position 64 corresponds with a position on the remote control 2 that has the greatest height that a user can touch. The position 64 can be located at the upper end 10 of the remote control 2 as illustrated or can be at any other location on a front portion of the remote control 2. The remote control magnet 36 and the cradle magnet 41 collectively have a center of gravity 65. The remote control 2 as a whole has a center of gravity 66. A bottom contact point 67 represents an idealized reaction point for forces of the cradle 3 when the cradle 3 is mounted to the wall 55.

A length 68 corresponds with a distance measured in the length dimension L between the position 64 and the bottom contact point 67. A length 69 corresponds with a distance measured in the length dimension L between the lengthwise position 65 of the remote control magnet 36 and the cradle magnet 41 and the bottom contact point 67. A length 70 corresponds with a distance measured in the length dimension L between the center of gravity 67 of the remote control 2 and the bottom contact point 67. A height 71 corresponds with a distance measured in the height dimension H between the bottom contact point 67 and the center of gravity 66 of the remote control 2. A height 72 corresponds with a distance measured in the height dimension H between the bottom contact point 67 and the position 64.

For the remote control 2 to be held in place, a total of all forces acting on the remote control 2 must be zero. That is, a sum of a magnetic retention force generated between the remote control magnet 36 and the cradle magnet 41 times the length 69 and the force of gravity times the height 71 must equal zero for the remote control 2 to be stationary in the cradle 3. Said another way, for the remote control 2 to remain seated in the cradle 3 when the cradle 3 is mounted on the wall 55, the magnetic retention force generated between the remote control magnet 36 and the cradle magnet 41 must at least be equal to the gravitational force acting on the remote control 2 times a ratio of the height 71 to the length 69. For a user to remove the remote control 2 from the cradle 3, an amount of force applied to the remote control 2 by the user must exceed the magnetic retention force generated between the remote control magnet 36 and the cradle magnet 41. Said yet another way, a directional component of the magnetic retention force generated between the remote control magnet 36 and the cradle magnet 41 must be greater than or equal to a corresponding directional component of the gravitational force acting on the remote control 2.

In order to avoid accidental removal of the remote control 2 from the cradle 3 when, for example, a user applies a force to the position 64 (e.g. when a presses one of the actuators 6) while the remote control 2 is located in the cradle 3 on the wall 55, it is contemplated that the magnetic retention force generated between the remote control magnet 36 and the cradle magnet 41 can be calibrated to exceed the force of gravity, factoring in a minimum user applied force at the position 64. That is, a sum of a magnetic retention force generated between the remote control magnet 36 and the cradle magnet 41 times the length 69, the force of gravity times the height 71, a vector of a user applied force in the length dimension L times the length 68, and a vector of a user applied force in the height dimension H times the height 72 must equal zero for the remote control 2 to be stationary in the cradle 3, while also ensuring that a user can apply a typical operational force to the remote control 2 as it is seated on the cradle 3 without accidentally removing the remote control 2 from the cradle 3.

For example, a user applying force of at least 5 pounds can remove the remote control 2 from the cradle 3, and a force less than 5 pounds, such as a user accidentally brushing past the remote control 2 while it is mounted in the cradle 3 or a light breeze if the remote control 2 is mounted outdoors, will not accidentally knock the remote control 2 off of the cradle 3.

The disclosed remote control assembly is easy to use. The magnetic connection between the remote control and the cradle and the complimentary profiles of the remote control and the cradle allow for a user to quickly and without much thought secure the remote control to the wall without needing to focus on aligning or latching specific components of the remote control and cradle. Removal of the remote control from the cradle is also simple since a user can lift the remote control in any direction away from the wall.

Further, since no screws or other mounting hardware are visible to the user on the front of the cradle, the cradle has a minimally obtrusive appearance when mounted on a wall and the remote control is removed from the cradle.

In addition to being easy to use, the disclosed remote control assembly is easy to assemble and disassemble. The deflectable tabs being continuous with the facia allows for a reduction in manufacturing steps compared to, for example, adding separate sprung or pressable buttons to the face of the remote control. Additionally, a user has flexibility in how they would like to attach the wall mount to the wall. A user can use screws, nails or other fasteners that extend through the wall mount and into the wall, or a user can use an adhesive strip. The option to use an adhesive strip as opposed to screws means that a user does not need to drill holes in the wall to mount the remote control assembly. Further, the remote control assembly can be easily removed from the wall and reinstalled in another location. Furthermore, during removal, the adhesive strip can be pulled out of the conveniently located cut-out in the wall mount, which prevents damage to the wall surface during adhesive removal.

Misalignment of the wall mount and the cradle is prevented owing to the alignment ledges. Disassembly is also simplified as a user can remove the adhesive joining the wall mount and the cradle by pulling a tab of the adhesive strip through the cut-out of the wall mount.

Further aspects are provided by the subject matter of the following clauses:

A method of retaining a remote control in a wall-mounted cradle, with the remote control having a rear portion and the cradle having a peripheral wall at least partially defining a recess fully receiving the rear portion of the remote control to seat the remote control in the recess, the method comprising applying a magnetic retention force between the remote control and the cradle, with the magnetic retention force having a component greater than the gravitation force acting on the remote control, and applying a reactive force from the pocket to the rear portion of the remote control, where the reactive force is applied to the rear portion of the remote control at a location less than 15% of the height of the remote control.

The method of any preceding clause wherein the reactive force is applied at a location less than 12% of the height of the remote control.

The method of any preceding clause wherein the reactive force is applied at a location greater than 5% of the height of the remote control.

The method of any preceding clause wherein the reactive force is applied at a location greater than 9% of the height of the remote control.

The method of any preceding clause wherein the reactive force is applied about the extent of the recess.

The method of any preceding clause wherein the reactive force is applied continuously about the extent of the recess.

The method of any preceding clause wherein the magnetic retention force is centered in the upper half of the recess.

The method of any preceding clause wherein the magnetic retention force is centered between 70% and 80% of the length of the recess with 0% being located at a lower end of the pocket and 100% being located at an upper end of the recess.

The method of any preceding clause wherein the magnetic retention force is greater than or equal to the gravitational force acting on the remote control times a ratio of a first height to a second height, the first height being measured between a bottom contact point where the remote control meets the cradle and a center of gravity of the remote control, and the second height being measured between the bottom contact point and a front portion of the remote control.

The method of any preceding clause wherein a sum of the magnetic retention force, the reactive force, and a user applied force is greater than or equal to zero.

The method of any preceding clause wherein when a force of 5 pounds or less is applied to the remote control, the remote control is retained in the cradle.

What is claimed is:

1. A remote control comprising:

an inner structural housing having a printed circuit board (PCB) mount;

a PCB mounted to the PCB mount and having multiple switches;

an outer housing having an open-faced body partially defining an interior; and a facia closing the open-face body and having multiple actuators, wherein the facia is a monolithic body, and the actuators are integrally formed in the monolithic body;

wherein the inner structural housing is received within the interior such that the PCB faces the facia, and the actuators are in correspondence to the switches;

wherein the actuator comprises a deflectable tabs;

wherein a latch extending from the deflectable tabs securing the facia to the PCB.

2. The remote control of claim 1 wherein a catch slots formed in the PCB and corresponds to the latch extending from deflectable tabs.

3. The remote control of claim 2 wherein the latch comprises resilient hooks.

4. The remote control of claim 1 wherein the monolithic body defines an outer periphery, and spaced slots extend through the outer periphery.

5. The remote control of claim 4 wherein the monolithic body defines a longitudinal body axis, and the spaced slots are generally perpendicular to the longitudinal body axis.

6. The remote control of claim 1 wherein the inner structural housing comprises a magnet recess.

7. The remote control of claim 1 wherein the inner structural housing comprises a battery recess.

8. The remote control of claim 6 further comprising a magnet located within the magnet recess.

9. The remote control of claim 1 further comprising a frame carried by the inner structural housing and located between the PCB and the facia.

10. The remote control of claim 1 further comprising a snap-fit connection securing the inner structural housing to the outer housing.

* * * * *